US012689179B2

(12) United States Patent

Yamatoya et al.

(10) Patent No.: US 12,689,179 B2

(45) Date of Patent: Jul. 21, 2026

(54) SEMICONDUCTOR LASER DEVICE

(71) Applicant: Mitsubishi Electric Corporation, Tokyo (JP)

(72) Inventors: Takeshi Yamatoya, Tokyo (JP); Takashi Nagira, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 885 days.

(21) Appl. No.: 17/595,482

(22) PCT Filed: Aug. 2, 2019

(86) PCT No.: PCT/JP2019/030401

§ 371 (c)(1),
(2) Date: Nov. 17, 2021

(87) PCT Pub. No.: WO2021/024288

PCT Pub. Date: Feb. 11, 2021

(65) Prior Publication Data

US 2022/0231478 A1     Jul. 21, 2022

(51) Int. Cl.
| | |
|---|---|
| *H01S 5/026* | (2006.01) |
| *H01S 5/12* | (2021.01) |
| *H01S 5/227* | (2006.01) |

(52) U.S. Cl.
CPC .......... *H01S 5/0265* (2013.01); *H01S 5/1237* (2013.01); *H01S 5/227* (2013.01)

(58) Field of Classification Search
CPC .................................................... H01S 5/1237
See application file for complete search history.

(56) References Cited

FOREIGN PATENT DOCUMENTS

| | | | | | |
|---|---|---|---|---|---|
| GB | 2437784 A | * | 11/2007 | .......... | H01S 5/0615 |
| JP | H04-198913 A | | 7/1992 | | |
| JP | H04198913 | * | 7/1992 | | |
| JP | 2003-069135 | * | 3/2003 | | |
| JP | 2003-069135 A | | 3/2003 | | |
| JP | 2009-260192 A | | 11/2009 | | |
| JP | 2018067604 A | * | 4/2018 | | |

OTHER PUBLICATIONS

English Translation of JP H04198913 (Year: 1992).*
English Translation of JP 2018067604 (Year: 2018).*
International Search Report issued in PCT/JP2019/030401; mailed Oct. 1, 2019.

* cited by examiner

*Primary Examiner* — Minsun O Harvey
*Assistant Examiner* — Stephen Sutton Kotter
(74) *Attorney, Agent, or Firm* — Studebaker Brackett PLLC

(57)     ABSTRACT

Provided is a semiconductor laser device in which a distributed feedback laser part and an electro-absorption modulator part are formed on the same semiconductor substrate, and laser light emitted from the laser part is emitted from an emission end face of the modulator part. The laser part includes a first diffraction grating formed to extend in a direction of an optical axis of the laser light and the modulator part partially including a second diffraction grating formed to extend in the direction of the optical axis of the laser. A non-diffraction grating region in which a diffraction grating is not formed is interposed between the second diffraction grating of the modulator part and an emission end face of the laser part from which the laser light is emitted to the modulator part.

16 Claims, 10 Drawing Sheets

SEMICONDUCTOR LASER DEVICE

TECHNICAL FIELD

The present application relates to a semiconductor laser device.

BACKGROUND ART

In a semiconductor laser device in which an electro-absorption (EA) modulator and a distributed feedback laser are integrated, a structure in which a diffraction grating is formed in the EA modulator has been reported (for example, refer to Patent Document 1). In the semiconductor laser device of Patent Document 1, the diffraction grating is formed in an entire waveguide of an EA modulator region, and the diffraction grating is also formed in a separation region where a modulator electrode and a laser electrode are separated, that is, a region between the distributed feedback laser region and the EA modulator region.

CITATION LIST

Patent Document

Patent Document 1: Japanese Patent Application Laid-open No. H4-198913 (FIG. 1)

SUMMARY OF INVENTION

Problems to be Solved by Invention

In the semiconductor laser device of Patent Document 1, the diffraction grating is formed from an emission end face from which laser light of the distributed feedback laser region is emitted up to an emission end face of the EA modulator region. Since light is reflected in the diffraction grating, the semiconductor laser device of Patent Document 1 has a problem in that light output of the emitted laser light is reduced by the diffraction grating formed in the EA modulator region and the region between the distributed feedback laser region and the EA modulator region.

A technology disclosed in the present application aims to increase an optical output of laser light in a semiconductor laser device in which an EA modulator and a distributed feedback laser that are formed with diffraction gratings are integrated.

Means for Solving Problems

In an example of a semiconductor laser device disclosed in the present application, a distributed feedback laser part and an electro-absorption modulator part are formed on the same semiconductor substrate, and laser light emitted from the laser part is emitted from an emission end face of the modulator part. The laser part includes a first diffraction grating formed to extend in a direction of an optical axis of the laser light, and the modulator part at least partially includes a second diffraction grating formed to extend in the direction of the optical axis of the laser, wherein a non-diffraction grating region in which a diffraction grating is not formed is interposed between the second diffraction grating of the modulator part and an emission end face of the laser part from which the laser light is emitted to the modulator part.

Effect of Invention

In an example of the semiconductor laser device disclosed in the present application, since the non-diffraction grating region in which the diffraction grating is not formed is interposed between the second diffraction grating of the modulator part and the emission end face of the laser part from which the laser light is emitted to the modulator part, light output of the laser light can be increased.

BRIEF DESCRIPTION OF DRAWINGS

FIG. 8 is a cross-sectional view of a mesa stripe of the second example in the semiconductor laser device of FIG. 1.

FIG. 9 is a cross-sectional view of a mesa stripe of the third example in the semiconductor laser device of FIG. 1.

MODES FOR CARRYING OUT INVENTION

Embodiment 1

Figure 1:
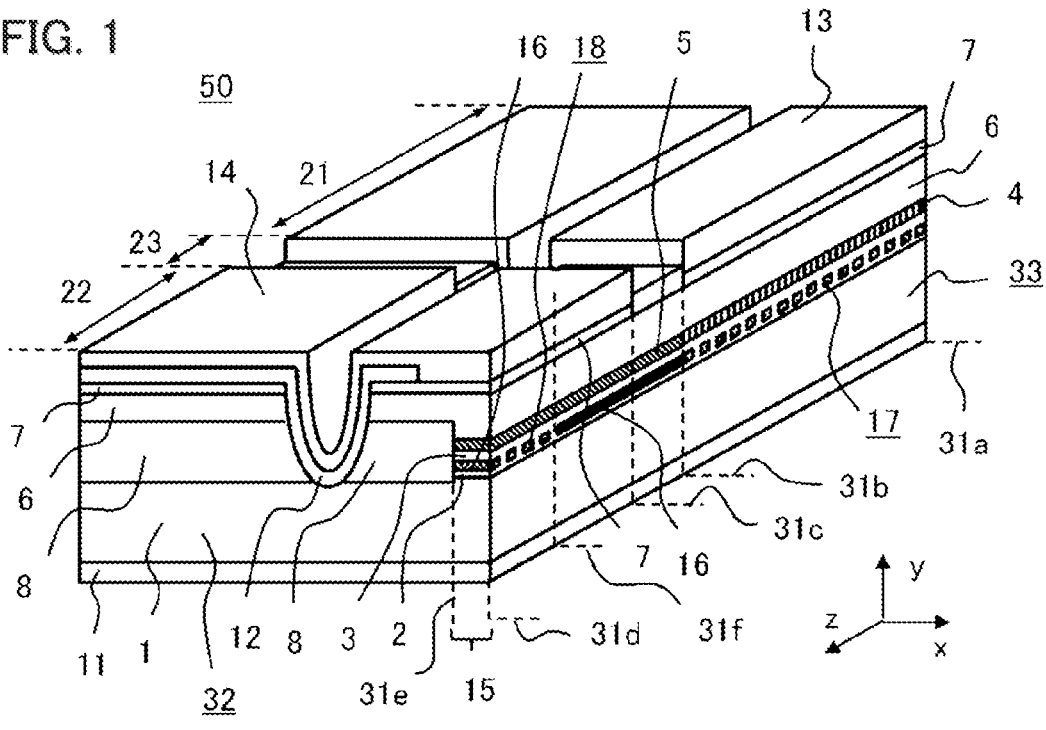
FIG. 1 is a perspective view showing a semiconductor laser device according to Embodiment 1.
Figure 2:
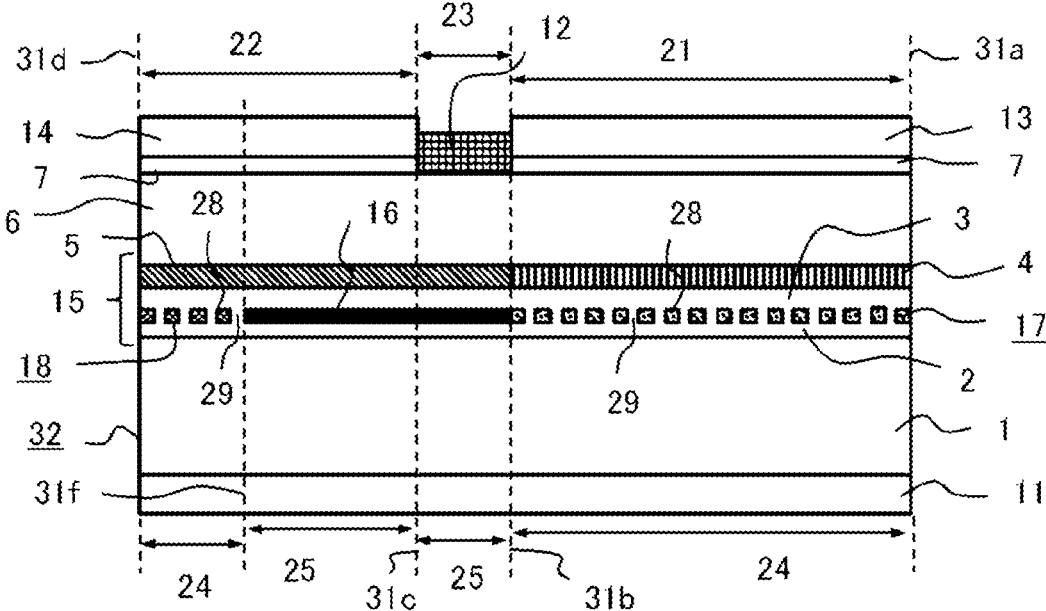
FIG. 2 is a cross-sectional view of a mesa stripe of the first example in the semiconductor laser device of FIG. 1.
Figure 3:
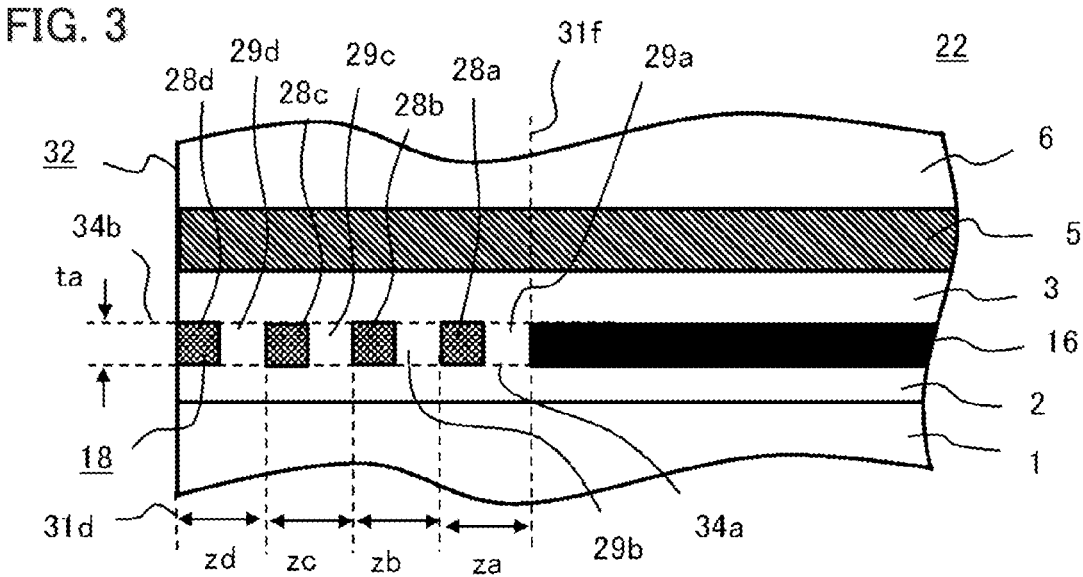
FIG. 3 is a diagram showing a diffraction grating in a modulator part of FIG. 1.
Figure 4:
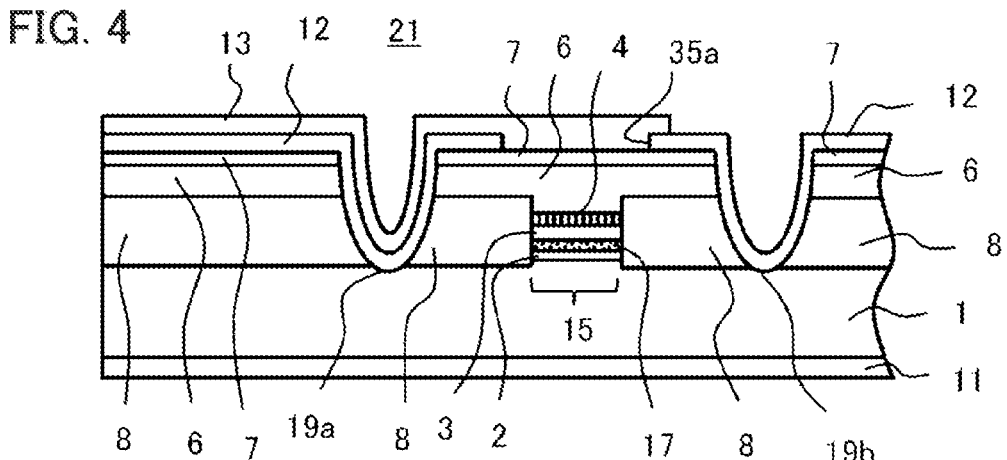
FIG. 4 is a cross-sectional view of a laser part in the semiconductor laser device of FIG. 1.
Figure 5:
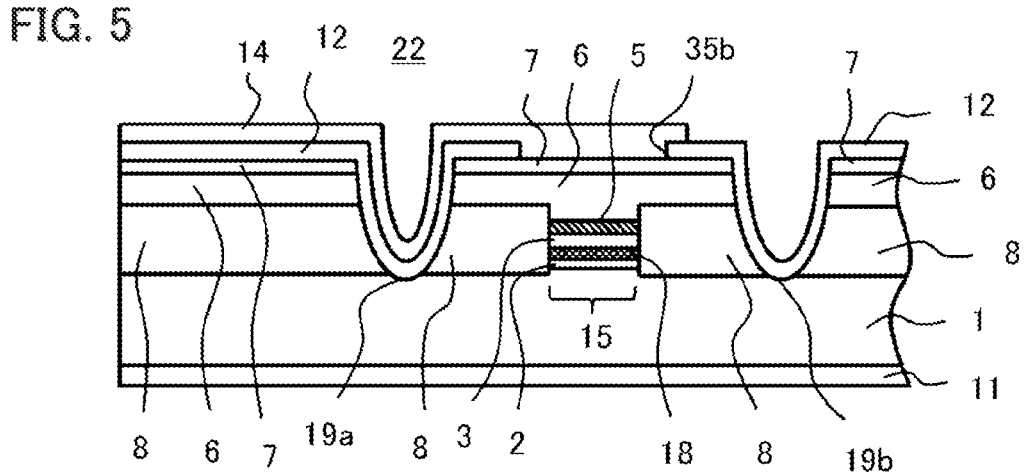
FIG. 5 is a cross-sectional view of the modulator part in the semiconductor laser device of FIG. 1.
Figure 6:
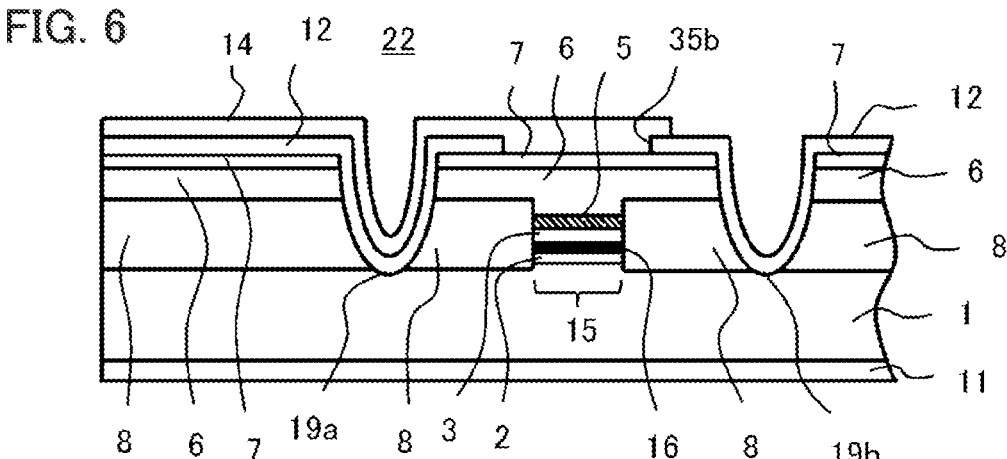
FIG. 6 is a cross-sectional view of the modulator part in the semiconductor laser device of FIG. 1.
Figure 7:
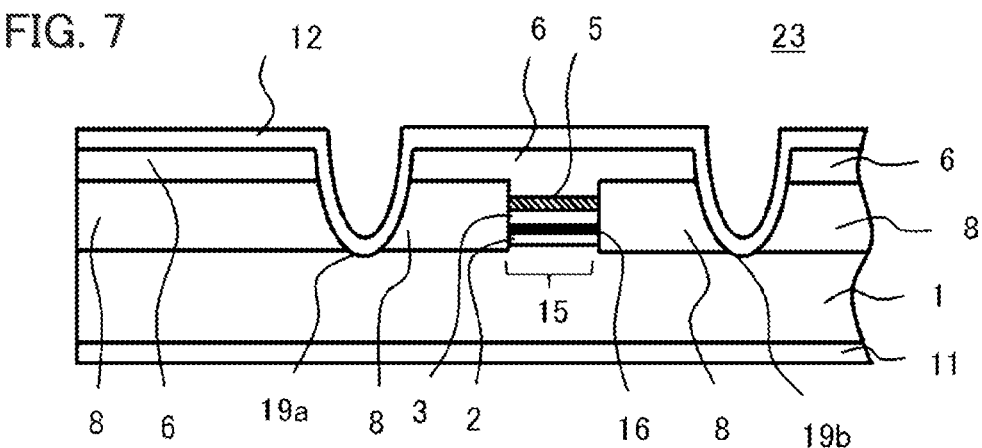
FIG. 7 is a cross-sectional view of a separation part in the semiconductor laser device of FIG. 1.
Figures 8, 9:
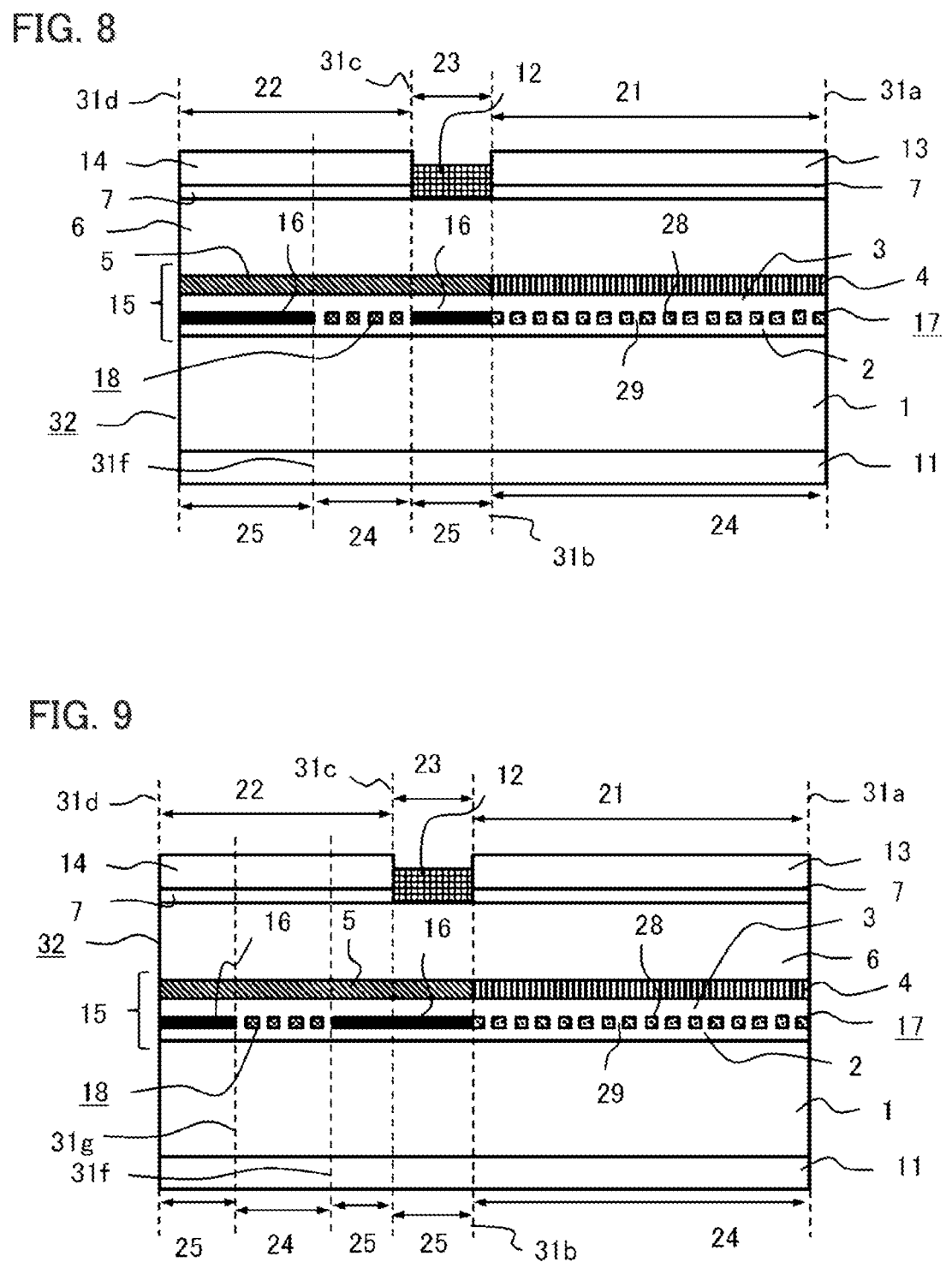
Figure 10:
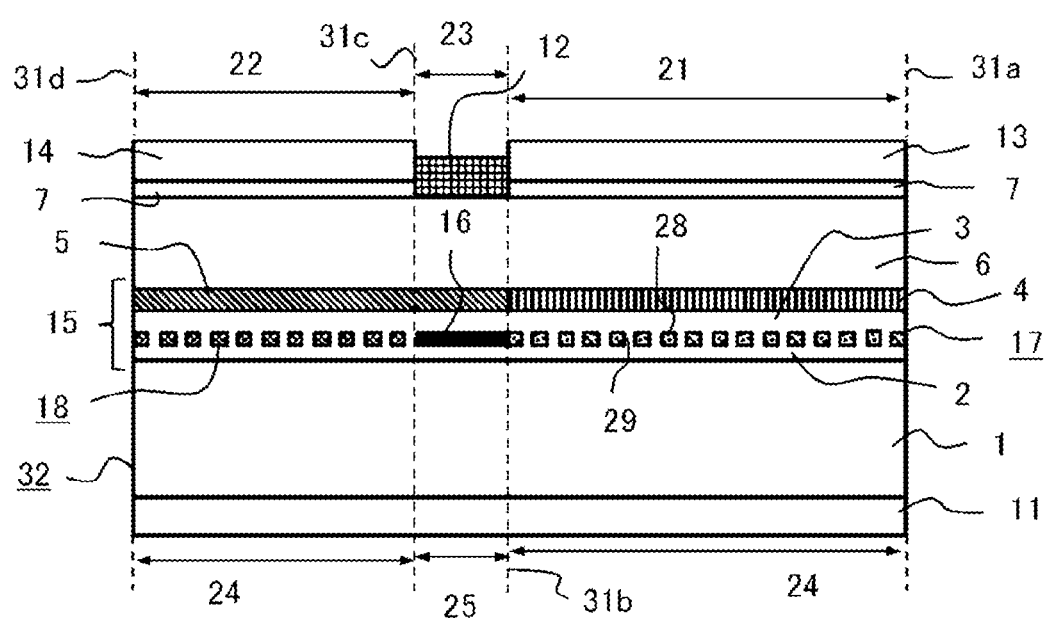
FIG. 10 is a cross-sectional view of a mesa stripe of the fourth example in the semiconductor laser device of FIG. 1.

A semiconductor laser device 50 of Embodiment 1 will be described referring to the drawings. The same or corresponding components are denoted by the same reference numerals, and repetitive description may be omitted. In other embodiments, the same or corresponding components are denoted by the same reference numerals, and repetitive description may be omitted. FIG. 1 is a perspective view showing the semiconductor laser device according to Embodiment 1. FIG. 2 is a cross-sectional view of a mesa stripe of the first example in the semiconductor laser device of FIG. 1, and FIG. 3 is a diagram showing a diffraction grating in a modulator part of FIG. 1. FIG. 4 is a cross-sectional view of a laser part in the semiconductor laser device of FIG. 1, and FIG. 5 and FIG. 6 each are a cross-sectional view of a modulator part in the semiconductor laser device of FIG. 1. FIG. 7 is a cross-sectional view of a separation part in the semiconductor laser device of FIG. 1. FIG. 8 is a cross-sectional view of a mesa stripe of the second example in the semiconductor laser device of FIG. 1, FIG. 9 is a cross-sectional view of a mesa stripe of the third example in the semiconductor laser device of FIG. 1, and FIG. 10 is a cross-sectional view of a mesa stripe of the fourth example in the semiconductor laser device of FIG. 1. FIG. 1 also shows a waveguide cross section 33 parallel to the z-direction, which is the emission direction of the laser light and the optical axis direction. FIG. 4 to FIG. 7 show cross sections perpendicular to the z-direction.

The semiconductor laser device 50 of Embodiment 1 includes a laser part 21, a modulator part 22, and a separation part 23. A distributed feedback laser is formed in the laser part 21. The modulator part 22 is an electro-absorption (EA) modulator monolithically formed on an n-InP semiconductor substrate 1, and the semiconductor laser device 50 is an electro-absorption (EA) modulator integrated semiconductor laser. The laser part 21 is formed in a region between the dashed lines 31$a$ and 31$b$, the separation part 23 is formed in a region between the dashed lines 31$b$ and 31$c$, and the modulator part 22 is formed in a region between the dashed lines 31$c$ and 31$d$. In the semiconductor laser device 50 of Embodiment 1, the laser part 21 of the distributed feedback type and the modulator part 22 of the electro-absorption type are formed on the same semiconductor substrate 1, and the laser light emitted from the laser part 21 is emitted from an emission end face 32 of the modulator part 22.

The laser part 21 comprises a semiconductor substrate 1, a first cladding layer 2 of n-InP, a diffraction grating material layer 16 in which a diffraction grating 17 is formed, a second cladding layer 3 of n-InP, an active layer 4, a third cladding layer 6 of p-InP, an InP buried layer 8, a contact layer 7 of p-InGaAs, an insulating film 12 of $SiO_2$, a cathode electrode 11 formed on a rear surface of the semiconductor substrate 1, and a first anode electrode 13 formed on the front side of the semiconductor substrate 1 and connected to the contact layer 7. The modulator part 22 comprises the semiconductor substrate 1, the first cladding layer 2 of n-InP, the diffraction grating material layer 16 having a diffraction grating 18 partially formed therein, the second cladding layer 3 of n-InP, an absorption layer 5, the third cladding layer 6 of p-InP, the InP buried layer 8, the contact layer 7 of p-InGaAs, the insulating film 12 of $SiO_2$, the cathode electrode 11 formed on the rear surface of the semiconductor substrate 1, and a second anode electrode 14 formed on the front side of the semiconductor substrate 1 and connected to the contact layer 7. The separation part 23 is a structure in a region (separation region, isolation region) for separating the laser part 21 and the modulator part 22. The separation part 23 comprises the semiconductor substrate 1, the first cladding layer 2 of n-InP, the diffraction grating material layer 16 in which no diffraction grating is formed, the second cladding layer 3 of n-InP, the absorption layer 5, the third cladding layer 6 of p-InP, the InP buried layer 8, the insulating film 12 of $SiO_2$, and the cathode electrode 11 formed on the rear surface of the semiconductor substrate 1. In FIG. 1, the z-direction is the direction of the optical axis of the laser light emitted by the laser part 21, the x-direction is the direction perpendicular to the z-direction, in which the layers provided in the semiconductor laser device 50 extend, and the y-direction is the direction perpendicular to the x-direction and the z-direction, in which the layers provided in the semiconductor laser device 50 are stacked.

The active layer 4 is composed of an InGaAsP multiple quantum well. The absorption layer 5 is composed of an InGaAsP multiple quantum well. In the laser part 21, the diffraction grating 17 having a recess 29 formed in the diffraction grating material layer 16 of InGaAsP is provided in a lower layer under the active layer 4, that is, between the first cladding layer 2 and the second cladding layer 3 on the side to the semiconductor substrate 1. In the modulator part 22, a diffraction grating material layer 16 of the same InGaAsP as the laser part 21 is formed, and the diffraction grating 18 in which recesses 29$a$, 29$b$, 29$c$ and 29$d$ are formed is provided partially in the diffraction grating material layer 16. FIG. 1 and FIG. 2 show an example in which the diffraction grating 18 is provided only on the side of the emission end face 32 opposite to the laser part 21. The separation part 23 is also provided with the diffraction grating material layer 16 of InGaAsP, which is the same as that in the laser part 21, but is not provided with the diffraction grating with the recess 29 being formed.

A mesa stripe 15, which is a mesa extending in the direction (z-direction) of the optical axis of the laser light emitted by the laser part 21, is formed in the laser part 21. The mesa stripe 15 of the laser part 21 is composed of the first cladding layer 2, the diffraction grating material layer 16 in which the diffraction grating 17 is formed, the second cladding layer 3, the active layer 4, and a part of the third cladding layer 6. A part of the third cladding layer 6 constituting the mesa stripe 15 is a portion between the active layer 4 and the surface position of the buried layer 8 opposite side of the semiconductor substrate 1. The mesa stripe 15 is continuously formed in the laser part 21, the separation part 23, and the modulator part 22. Although the mesa stripe 15 is continuously formed, the mesa stripe 15 in the laser part 21, the separation part 23, and the modulator part 22 may be described separately as a first mesa stripe, a third mesa stripe, and a second mesa stripe, respectively. The laser part 21 includes the diffraction grating 17 which is a first diffraction grating formed to extend in the direction of the optical axis of the laser light.

The mesa stripe 15 of the modulator part 22 is composed of the first cladding layer 2, the diffraction grating material layer 16 including a portion where the diffraction grating 18 is formed, the second cladding layer 3, the absorption layer 5, and the part of the third cladding layer 6. The mesa stripe 15 of the separation part 23 is composed of the first cladding layer 2, the diffraction grating material layer 16 in which no diffraction grating is formed, the second cladding layer 3, the absorption layer 5, and the part of the third cladding layer 6. The part of the third cladding layer 6 constituting the mesa stripe 15 is a portion between the absorption layer 5 and the surface position of the buried layer 8 opposite side of the semiconductor substrate 1. The modulator part 22 includes the diffraction grating 18, which is a second diffraction grating extended and formed in the direction of the optical axis of the laser light. Grooves 19$a$ and 19$b$ are formed on both sides of the mesa stripe 15 of the laser part 21, the separation part 23, and the modulator part 22 in the x-direction so as to penetrate through the buried layer 8 and the third cladding layer 6 and reach the semiconductor substrate 1. In the laser part 21 and the modulator part 22, the grooves 19$a$ and 19$b$ also penetrate through the contact layer 7. In the laser part 21 and the modulator part 22, the insulating film 12 is formed on the surface of the contact layer 7 and the grooves 19$a$ and 19$b$. In the separation part 23, the insulating film 12 is formed on the surface of the third cladding layer 6 and the grooves 19$a$ and 19$b$. The first anode electrode 13 of the laser part 21 is connected to the contact layer 7 through an opening 35$a$ formed in the insulating film 12. The second anode electrode 14 of the modulator part 22 is connected to the contact layer 7 through an opening 35*b* formed in the insulating film 12.

In the semiconductor laser device 50 of Embodiment 1, the film thickness ta of the diffraction grating material layer 16 between the first cladding layer 2 and the second cladding layer 3 is the same in the laser part 21, the separation part 23 and the modulator part 22. In FIG. 3, a dashed line 34*a* indicates a rear surface of the diffraction grating material layer 16 (the face on the side to the semiconductor substrate 1), and a dashed line 34*b* indicates a front surface of the diffraction grating material layer 16 (the face on the side opposite to the semiconductor substrate 1). As shown in FIG. 2, in the mesa stripe 15, the modulator part 22 includes a diffraction grating region 24 in which the diffraction grating 18 is formed and a non-diffraction grating region 25 in which the diffraction grating 18 is not formed. In the modulator part 22, the diffraction grating region 24 is the region from a dashed line 31*f* to a dashed line 31*d*, and the non-diffraction grating region 25 is the region from the dashed line 31*c* to the dashed line 31*f*. As described above, the diffraction grating 18 is formed on the side of the emission end face 32, and the non-diffraction grating region 25 is provided on the side to the laser part 21 in the modulator part 22. As shown in FIG. 3, the diffraction grating 18 includes four protrusions 28*a*, 28*b*, 28*c*, and 28*d* and four recesses 29*a*, 29*b*, 29*c*, and 29*d*. The protrusions 28*a*, 28*b*, 28*c*, and 28*d* of the modulator part 22 protrude in a direction perpendicular to the semiconductor substrate 1, and the recesses 29*a*, 29*b*, 29*c*, and 29*d* of the modulator part 22 are recessed toward the side to the semiconductor substrate 1 from the faces of the protrusions 28*a*, 28*b*, 28*c*, 28*d* of the modulator part 22 on the side opposite to the semiconductor substrate 1. In FIG. 2 and FIG. 3, the thicknesses of the protrusions 28*a*, 28*b*, 28*c* and 28*d* are the same, and the depths of the recesses 29*a*, 29*b*, 29*c* and 29*d* formed by removing the diffraction grating material layer 16 are the same as the film thickness ta of the diffraction grating material layer 16. The reference numeral 28 is collectively used for the protrusions, and 28*a*, 28*b*, 28*c*, and 28*d* are used for distinction. The reference numeral 29 is collectively used for the recesses, and 29*a*, 29*b*, 29*c* and 29*d* are used for distinction.

In FIG. 3, the interval between the dashed line 31*f* and the end of the protrusion 28*a* on the side to the emission end face 32 is za, the interval between the end of the protrusion 28*a* on the side to the emission end face 32 and the end of the protrusion 28*b* on the side to the emission end face 32 is zb, the interval between the end of the protrusion 28*b* on the side to the emission end face 32 and the end of the protrusion 28*c* on the side to the emission end face 32 is zc, and the interval between the end of the protrusion 28*c* on the side to the emission end face 32 and the end of the protrusion 28*d* on the side to the emission end face 32 is zd. Note that, the end of the protrusion 28*d* on the side to the emission end face 32 coincides with the emission end face 32. The interval za, the interval zb, the interval zc, and the interval zd each are the interval in the protrusion 28 and the recess 29 that are adjacent in a pair, which are the same. FIG. 3 shows an example in which the width of the protrusion 28 in the z-direction and the width of the recess 29 in the z-direction are the same. In the diffraction grating 18 of Embodiment 1, the period in the protrusion 28 and the recess 29 is the same over the entire diffraction grating. That is, in the diffraction grating 18 of Embodiment 1, the period in the protrusion 28 and the recess 29 is uniform.

In the laser part 21, the diffraction grating 17 is formed over the entire mesa stripe 15 in the z-direction, that is, between the dashed line 31*a* and the dashed line 31*b*. That is, in the mesa stripe 15, the laser part 21 does not include the non-diffraction grating region 25 in which no diffraction grating is formed but includes only the diffraction grating region 24 in which diffraction gratings are formed totally. The diffraction grating 17 of the laser part 21 includes a plurality of protrusions 28 and a plurality of recesses 29. The protrusions 28 of the laser part 21 extend in the direction perpendicular to the semiconductor substrate 1, and the recesses 29 of the laser part 21 are recessed toward the side to the semiconductor substrate 1 from the faces of the protrusions 28 of the laser part 21 on the side opposite to the semiconductor substrate 1. FIG. 2 shows an example in which the depths of the recesses 29 formed by removing the diffraction grating material layer 16 are the same as the film thickness ta of the diffraction grating material layer 16. The interval in the protrusion 28 and recess 29 that are adjacent in a pair in the diffraction grating 17 of the laser part 21 is the same as the interval in the protrusion 28 and recess 29 that are adjacent in a pair in the diffraction grating 18 of the modulator part 22. In the diffraction grating 17 of Embodiment 1, the period in the protrusion 28 and the recess 29 is the same over the entire diffraction grating. That is, in the diffraction grating 17 of Embodiment 1, the period in the protrusion 28 and the recess 29 is uniform.

In the separation part 23, no diffraction grating is formed over the entire z-direction, that is, between the dashed lines 31*b* and 31*c*. That is, in the mesa stripe 15, the separation part 23 does not include the diffraction grating region 24 in which the diffraction grating is formed and but includes the non-diffraction grating region 25 in which the diffraction grating is not formed totally. In the semiconductor laser device 50 shown in FIG. 2, the non-diffraction grating region 25 in which no diffraction grating is formed is interposed between the diffraction grating 18 of the modulator part 22 and the emission end face (end portion indicated by the dashed line 31*b*) of the laser part 21 from which the laser light is emitted to the modulator part 22.

A method of manufacturing the semiconductor laser device 50 will be described. The first cladding layer 2 and the diffraction grating material layer 16 are sequentially crystal-grown on the surface of the semiconductor substrate 1 by a metal-organic chemical vapor deposition (MOCVD) method, and the recesses 29 are formed in the diffraction grating material layer 16 to form the diffraction gratings 17 and 18. The second cladding layer 3, the active layer 4, the absorption layer 5, and the part of the third cladding layer 6 are sequentially crystal-grown by MOCVD method on the surface of the diffraction grating material layer 16 including diffraction gratings 17, 18, and mesa stripe 15 is formed by dry etching using an SiO₂ mask. Then, the buried layer 8 is crystal-grown on the semiconductor substrate 1 exposed on both sides of the mesa stripe 15.

The SiO₂ mask is removed, the third cladding layer 6 and the contact layer 7 are sequentially crystal-grown on the surface of the buried layer 8 and the mesa stripe 15, and the contact layer 7 on the surface of the separation part 23 is removed by wet etching using a photoresist mask. After the photoresist mask is removed, the grooves 19*a* and 19*b* are formed by wet etching using the photoresist mask. The photoresist mask is removed, and the insulating film 12 is formed on the surfaces of the third cladding layer 6, the contact layer 7, and the grooves 19*a* and 19*b* of the separation part 23. The openings 35*a* and 35*b* in the insulating film 12 are formed using the photoresist mask. The photoresist mask is removed, metal layers are formed on the front and rear surfaces of the semiconductor laser device 50, and the cathode electrode 11, the first anode electrode 13, and the second anode electrode 14 are formed. Thereafter, the insulating film 12 is thickly formed between the first anode electrode 13 and the second anode electrode 14.

In the semiconductor laser device (the semiconductor laser device of the comparative example) in which the EA modulator and the distributed feedback laser are integrated and no diffraction grating is formed in the region of the EA modulator, reflected light of the laser light from the emission end face (the end face on the side of the modulator part) is incident on the distributed feedback laser, thereby causing an adiabatic chirp in which the oscillation wavelength of the distributed feedback laser varies. The adiabatic chirp also affects a transmission characteristic of the optical signal as it is transmitted through an optical fiber. In the semiconductor laser device of the comparative example, since the diffraction grating is not formed in the region of the EA modulator, the phase of the reflected light which is the return light reflected on the emission end face of the laser light (the end face on the side of the modulator part) changes for each semiconductor laser device in accordance with the cleavage position of the emission end face. In contrast, in the semiconductor laser device 50 of Embodiment 1, the diffraction grating 18 is provided in the modulator part 22. Therefore, in the semiconductor laser device 50 of Embodiment 1, since the phase of the reflected light of the laser light generated in the forward side of the element of the semiconductor laser device 50, that is, in the emission end face 32, is determined by a structural factor such as a starting position of the diffraction grating 18 on the side to the laser part 21 in the modulator part, it is possible to greatly suppress the phase variation of each of the semiconductor laser devices in which the phase of the reflected light from the forward side of the element varies for each semiconductor laser device. As a result, the semiconductor laser device 50 of Embodiment 1 can suppress variation in the amount of adiabatic chirp for each semiconductor laser device and can avoid a decrease in the transmission yield.

In the semiconductor laser device 50 according to Embodiment 1, it is not necessary to add the waveguide having the diffraction grating in the forward side of the modulator part 22, that is, on the side of the emission end face 32. Therefore, the semiconductor laser device 50 of Embodiment 1 is easy in the manufacturing process and has a smaller element size than the semiconductor laser device having the structure in which the waveguide having the diffraction grating is added, so that the cost can be reduced.

In the semiconductor laser device of Patent Document 1, the diffraction grating is formed in the entire waveguide of the EA modulator region, and the diffraction grating is also formed in the separation region where the modulator electrode and the laser electrode are separated. Since light is reflected by the diffraction grating, a problem arises in that the larger the area of the diffraction grating, the lower the optical output of the laser light from the semiconductor laser device. In contrast, in the semiconductor laser device 50 of Embodiment 1, as shown in FIG. 2 and FIG. 3, no diffraction grating is formed in the separating part 23 and on the side to the laser part 21 in the modulator part 22; that is, at least no diffraction grating is formed on the separation part 23, so that the optical output of the laser light can be increased as compared with the semiconductor laser device of Patent Document 1.

Although an example of the semiconductor laser device 50 in which the diffraction grating 18 is formed on the side of the emission end face 32 of the modulator part 22 has been described so far, the example of the arrangement of the diffraction grating 18 is not limited thereto. A non-diffraction grating region 25 should be interposed between the end (the emission end face) at which the laser light of the laser part 21 is emitted, that is, the end indicated by the dashed line 31b, and the diffraction grating 18 formed in the modulator part 22. In this case, since the non-diffraction grating region 25 in which the diffraction grating 18 is not formed exists between the laser part 21 and the emission end face 32, the light output of the laser light can be increased as compared with the semiconductor laser device of Patent Document 1 in which the diffraction grating is formed from the emission end face from which the laser light of the distributed feedback laser region is emitted, to the emission end face of the EA modulator region. The semiconductor laser device 50 including the mesa stripe 15 of the second example shown in FIG. 8 is an example in which the diffraction grating 18 is formed on the side to the laser part 21 in the mesa stripe 15 of the modulator part 22. In the modulator part 22 and the separation part 23 in the mesa stripe 15 of the second example shown in FIG. 8, a region between the dashed line 31c and the dashed line 31f is the diffraction grating region 24 in which the diffraction grating 18 is formed, and a region between the dashed line 31f and the dashed line 31d and a region between the dashed line 31b and the dashed line 31c is the non-diffraction grating region 25 in which no diffraction grating 18 is formed.

The semiconductor laser device 50 including the mesa stripe 15 of the third example shown in FIG. 9 is an example in which the diffraction grating 18 is formed in the center in the mesa stripe 15 of the modulator part 22. In the modulator part 22 and the separation part 23 in the mesa stripe 15 of the third example shown in FIG. 9, a region between the dashed line 31f and the dashed line 31g is the diffraction grating region 24 in which the diffraction grating 18 is formed, and a region between the dashed line 31b and the dashed line 31f and a region between the dashed line 31g and the dashed line 31d are the non-diffraction grating region 25 in which no diffraction grating 18 is formed. The semiconductor laser device 50 including the mesa stripe 15 of the fourth example shown in FIG. 10 is an example in which the diffraction grating 18 is formed over the entire mesa stripe 15 of the modulator part 22. Even in the semiconductor laser device 50 including the mesa stripe 15 of the fourth example shown in FIG. 10, since the non-diffraction grating region 25 in which the diffraction grating 18 is not formed exists between the emission end face of the laser part 21 and the emission end face 32 in the mesa stripe 15, the light output of the laser light can be increased as compared with the semiconductor laser device of Patent Document 1 in which the diffraction grating is formed from the emission end face from which the laser light of the distributed feedback laser region is emitted, to the emission end face of the EA modulator region.

Note that, the examples in which the separation part 23 is formed between the laser part 21 and the modulator part 22 has been described. However, even in the semiconductor laser device 50 in which the separation part 23 is not formed, the mesa stripe 15 should have a structure in which the non-diffraction grating region 25 in which the diffraction grating 18 is not formed exists between the emission end face of the laser part 21 and the emission end face 32. In this case, since the non-diffraction grating region 25 in which the diffraction grating 18 is not formed exists between the emission end face of the laser part 21 and the emission end face 32 in the mesa stripe 15, the light output of the laser light can be increased as compared with the semiconductor laser device of Patent Document 1 in which the diffraction grating is formed from the emission end face from which the laser light of the distributed feedback laser region is emitted, to the emission end face of the EA modulator region. The semiconductor laser device 50 in which the separation part 23 is not formed between the laser part 21 and the modulator part 22 is a device in which the contact layer 7 is not separated between the laser part 21 and the modulator part 22, as in the semiconductor laser device of Patent Document 1, for example (first example without the separation part). Further, the semiconductor laser device 50 in which the separation part 23 is not formed between the laser part 21 and the modulator part 22 is a device in which a step is provided between the laser part 21 and the modulator part 22 to separate the contact layer 7 and the first anode electrode 13 of the laser part 21 from the contact layer 7 and the second anode electrode 14 of the modulator part 22 (second example without the separation part). Note that, in the case of the first example without the separation part and the second example without the separation part, the structure of the mesa stripe 15 of the fourth example shown in FIG. 10 cannot be applied thereto.

As described above, the semiconductor laser device 50 of Embodiment 1 is the semiconductor laser device in which the laser part 21 of the distributed feedback type and the modulator part 22 of the electro-absorption type are formed on the same semiconductor substrate 1, and the laser light emitted from the laser part 21 is emitted from the emission end face 32 of the modulator part 22. In the semiconductor laser device 50 of Embodiment 1, the laser part 21 includes the first diffraction grating (diffraction grating 17) formed to extend in the direction of the optical axis of the laser light, and the modulator part 22 includes at least partially the second diffraction grating (diffraction grating 18) formed to extend in the direction of the optical axis of the laser light. In the semiconductor laser device 50 of Embodiment 1, the non-diffraction grating region 25 in which no diffraction grating is formed is interposed between the second diffraction grating (diffraction grating 18) of the modulator part 22 and the emission end face (end portion indicated by the dashed line 31b) of the laser part 21 from which the laser light is emitted to the modulator part 22. In the semiconductor laser device 50 of Embodiment 1, with this configuration, since the non-diffraction grating region 25 in which no diffraction grating is formed is interposed between the second diffraction grating (diffraction grating 18) of the modulator part 22 and the emission end face (end portion indicated by the dashed line 31b) of the laser part 21 from which the laser light is emitted to the modulator part 22, the light output of the laser light can be increased.

Embodiment 2

Figure 11:
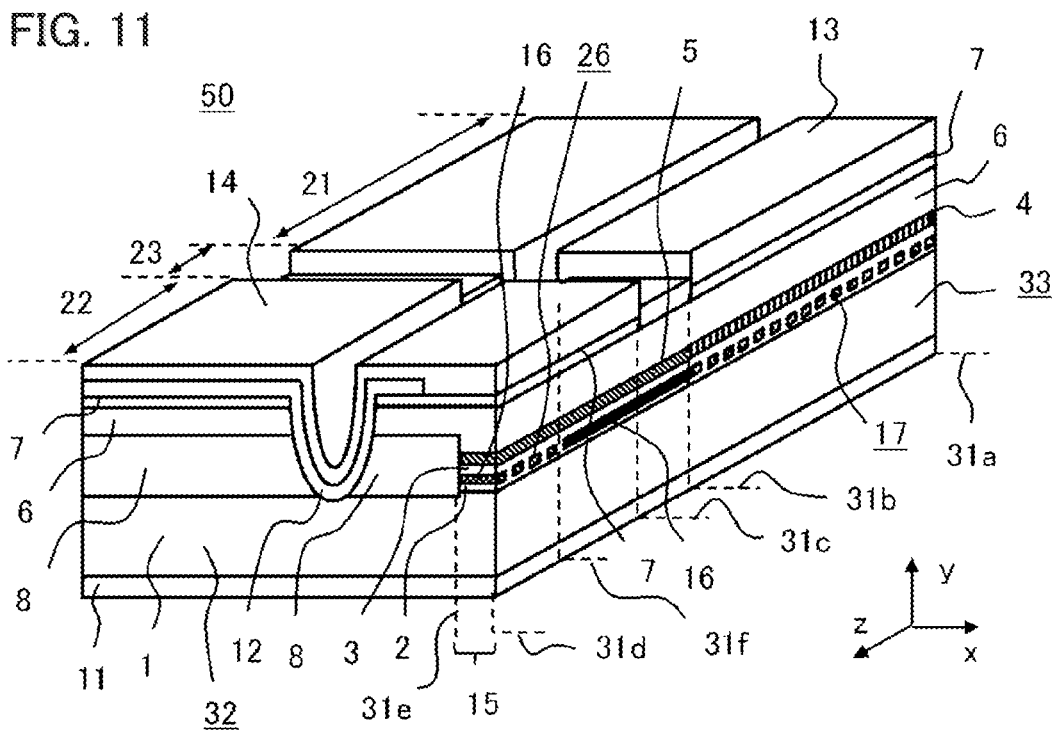
FIG. 11 is a perspective view showing a semiconductor laser device according to Embodiment 2.
Figure 12:
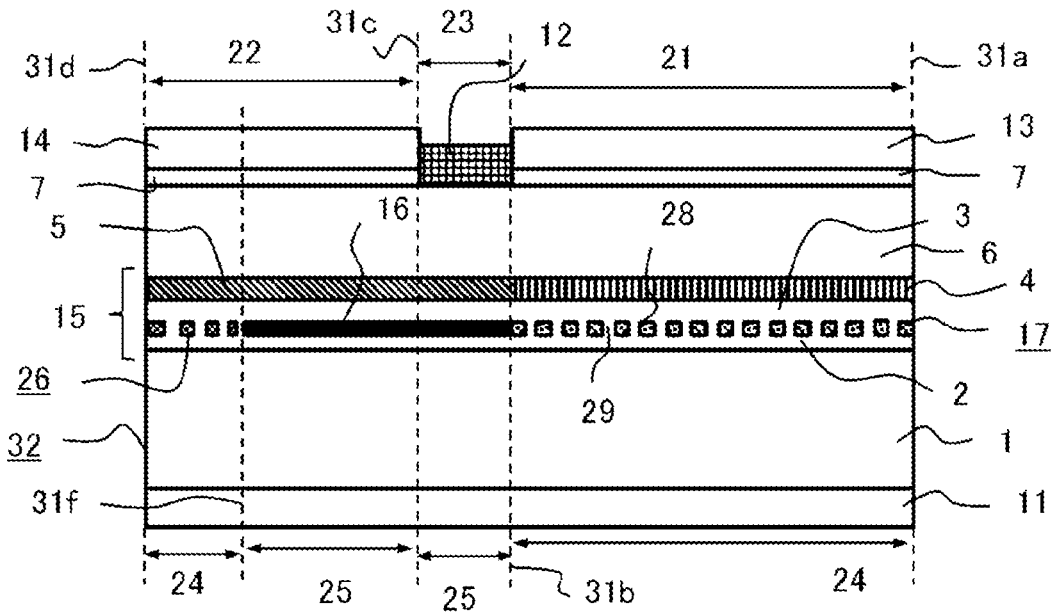
FIG. 12 is a cross-sectional view of a mesa stripe in the semiconductor laser device of FIG. 11.
Figure 13:
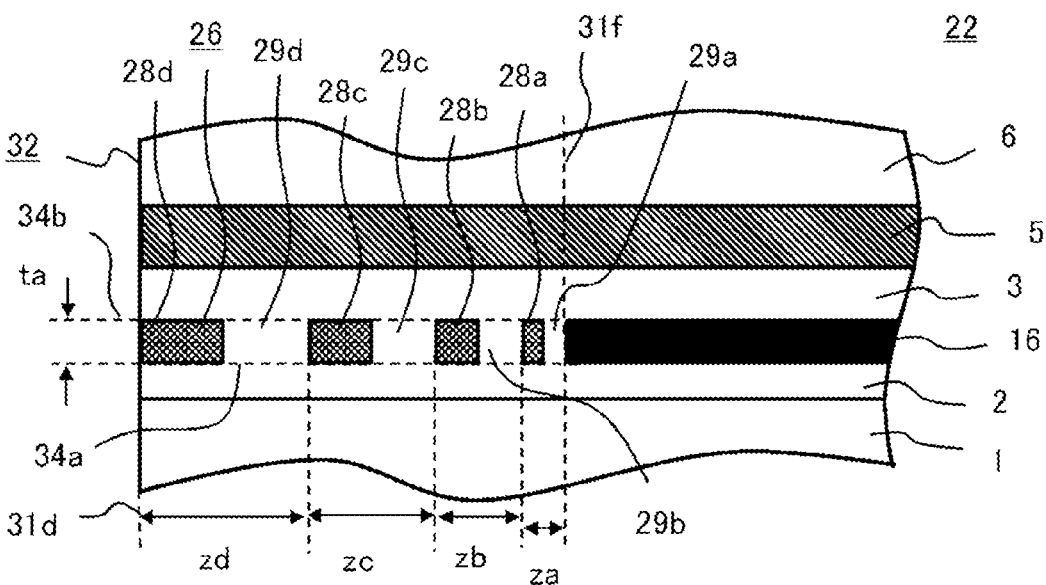
FIG. 13 is a diagram showing a diffraction grating in a modulator part of FIG. 11.
Figure 14:
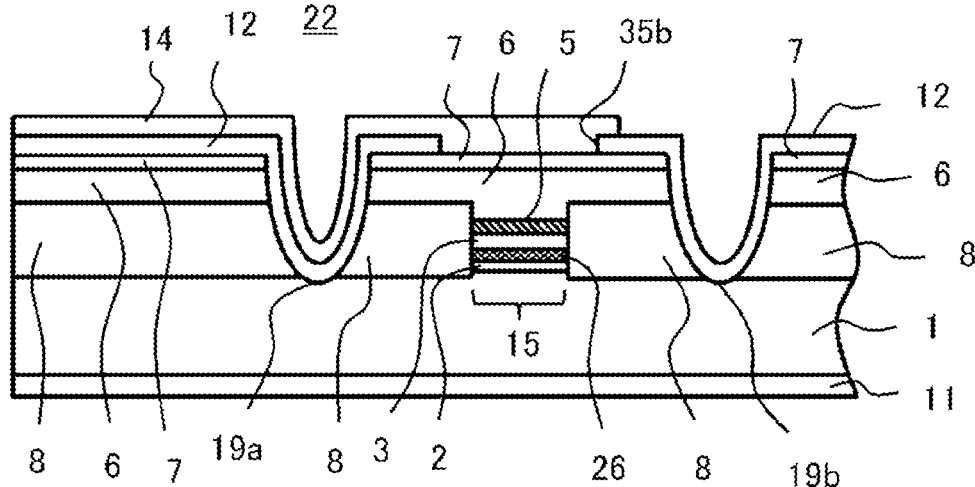
FIG. 14 is a cross-sectional view of the modulator part in the semiconductor laser device of FIG. 11.

FIG. 11 is a perspective view showing a semiconductor laser device according to Embodiment 2, and FIG. 12 is a cross-sectional view of a mesa stripe in the semiconductor laser device of FIG. 11. FIG. 13 is a diagram showing a diffraction grating in a modulator part of FIG. 11, and FIG. 14 is a cross-sectional view of the modulator part in the semiconductor laser device of FIG. 11. The semiconductor laser device 50 of Embodiment 2 is different from the semiconductor laser device 50 of Embodiment 1 in that a diffraction grating 26 having a non-uniform period is formed in the diffraction grating region 24 of the modulator part 22. Apart different from the semiconductor laser device 50 of Embodiment 1 will mainly be described.

As shown in FIG. 13, the diffraction grating 26 includes four protrusions 28a, 28b, 28c, and 28d and four recesses 29a, 29b, 29c, and 29d. FIGS. 12 and 13 show an example in which the depths of the recesses 29a, 29b, 29c and 29d formed by removing the diffraction grating material layer 16 are the same as the film thickness ta of the diffraction grating material layer 16. Note that, the reference numeral 28 is collectively used for the protrusions, and 28a, 28b, 28c, and 28d are used for distinction. The reference numeral 29 is collectively used for the recesses, and 29a, 29b, 29c and 29d are used for distinction.

In FIG. 13, the interval between the dashed line 31f and the end of the protrusion 28a on the side to the emission end face 32 is za, the interval between the end of the protrusion 28a on the side to the emission end face 32 and the end of the protrusion 28b on the side to the emission end face 32 is zb, the interval between the end of the protrusion 28b on the side to the emission end face 32 and the end of the protrusion 28c on the side to the emission end face 32 is zc, and the interval between the end of the protrusion 28c on the side to the emission end face 32 and the end of the protrusion 28d on the side to the emission end face 32 side is zd. Note that, the end of the protrusion 28d on the side to the emission end face 32 coincides with the emission end face 32. The interval za, the interval zb, the interval zc, and the interval zd each are the interval in the protrusion 28 and the recess 29 that are adjacent in a pair, which are different. In FIG. 13, the intervals za, zb, zc, and zd have the relationship of formula (1), and an example is shown in which the width in the z-direction of the protrusion 28 and the width in the z-direction of the recess 29 are the same.

$$zd > zc > zb > za \qquad (1)$$

In the diffraction grating 26 of Embodiment 2, the interval in the protrusion 28 and the recess 29 is non-uniform in the z-direction which is the emission direction of the laser light. That is, in the diffraction grating 26 of Embodiment 2, the period in the protrusion 28 and the recess 29 is non-uniform.

In the diffraction grating, which wavelength of light is reflected depends on the period of the diffraction grating. Therefore, in the diffraction grating 26 of Embodiment 2 in which the period of the diffraction grating is non-uniform, the wavelength band of light reflection that occurs at the diffraction grating 26 of the modulator part 22 can be expanded as compared with the case where the diffraction grating has a uniform period. That is, the semiconductor laser device 50 of Embodiment 2 provided with the diffraction grating 26 having the non-uniform period in the modulator part 22 can expand the wavelength band of the light reflection that occurs at the diffraction grating as compared with the semiconductor laser device 50 of Embodiment 1 provided with the diffraction grating 18 having the uniform period in the modulator part 22. Thus, in the semiconductor laser device 50 of Embodiment 2, even when the drive conditions of the laser part 21 and the modulator part 22 change or when the element size of the semiconductor laser device 50 changes due to manufacturing variation, the output light generated from the laser part 21 can be reliably reflected by the diffraction grating 26 of the modulator part 22 toward the side of the laser part 21. That is, in the semiconductor laser device 50 of Embodiment 2, the effects of the semiconductor laser device 50 of Embodiment 1 that the variation of the amount of adiabatic chirp for each semiconductor laser device can be suppressed and the decrease in the transmission yield can be avoided can be obtained even in one or both of the case where the drive conditions change and the case where the manufacturing variation occurs as compared with the semiconductor laser device 50 of Embodiment 1. That is, the semiconductor laser device 50 of Embodiment 2 is more resistant to the change in the drive conditions and the manufacturing variation than the semiconductor laser device 50 of Embodiment 1.

The semiconductor laser device 50 of Embodiment 2 has the same structure as the semiconductor laser device 50 of Embodiment 1 except for the period of the diffraction grating of the modulator part 22. Therefore, since the semiconductor laser device 50 of Embodiment 2 has the structure in which at least the diffraction grating 26 is not formed in the separation part 23 or the structure in which the non-diffraction grating region 25 in which the diffraction grating 26 is not formed exists between the emission end face of the laser part 21 and the emission end face 32, as in the semiconductor laser device 50 of Embodiment 1, it is possible to increase the optical output of the laser light as compared with the semiconductor laser device of Patent Document 1.

The semiconductor laser device 50 of Embodiment 2 is provided with the diffraction grating 26 having the non-uniform period in the mesa stripe 15 of the modulator part 22, so that the reflected light that occurs at the forward side of the element of the semiconductor laser device 50, that is, at the emission end face 32, is directed to a position away from the absorption layer 5 and the active layer 4 by the diffraction grating 26 of the modulator part 22 in which the wavelength band of light reflection is expanded. Therefore, the propagation of the reflected light from the forward side of the element to the active layer 4 of the laser part 21 can be suppressed, the variation of the amount of adiabatic chirp for each semiconductor laser device can be suppressed, and the decrease in the transmission yield can be avoided.

In the semiconductor laser device 50 of Embodiment 2, similarly to the semiconductor laser device 50 of Embodiment 1, it is not necessary to add the waveguide provided with the diffraction grating in the forward side of the modulator part 22, that is, on the side of the emission end face 32. Therefore, the semiconductor laser device 50 according to Embodiment 2 is easy in the manufacturing process and has a smaller element size than the semiconductor laser device having the structure in which the waveguide provided with the diffraction grating is added, so that the cost can be reduced.

Embodiment 3

Figure 15:
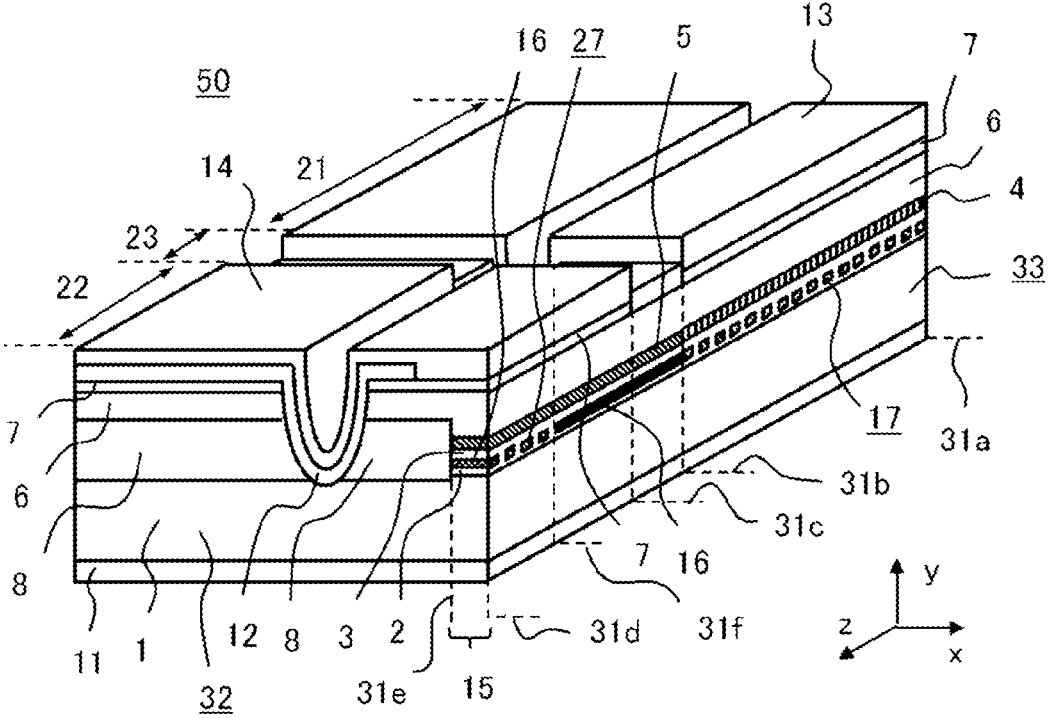
FIG. 15 is a perspective view showing a semiconductor laser device according to Embodiment 3.
Figure 16:
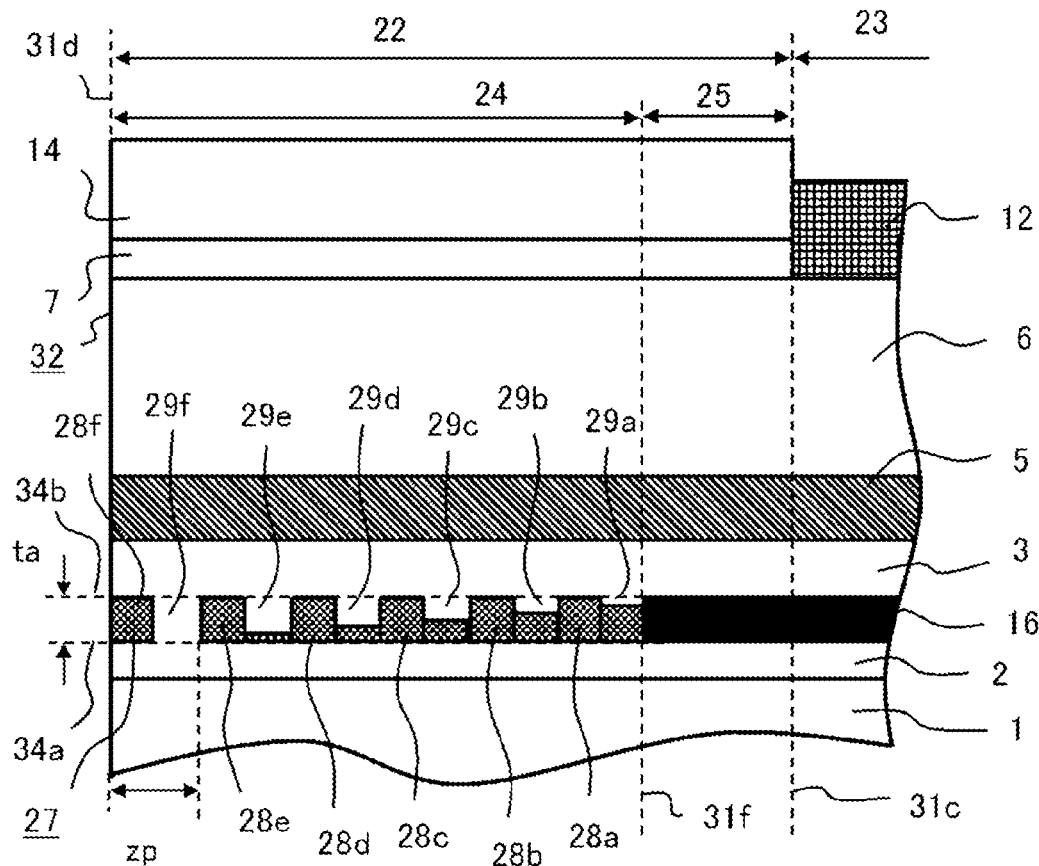
FIG. 16 is a diagram showing a diffraction grating of the first example in a modulator part of FIG. 15.
Figure 17:
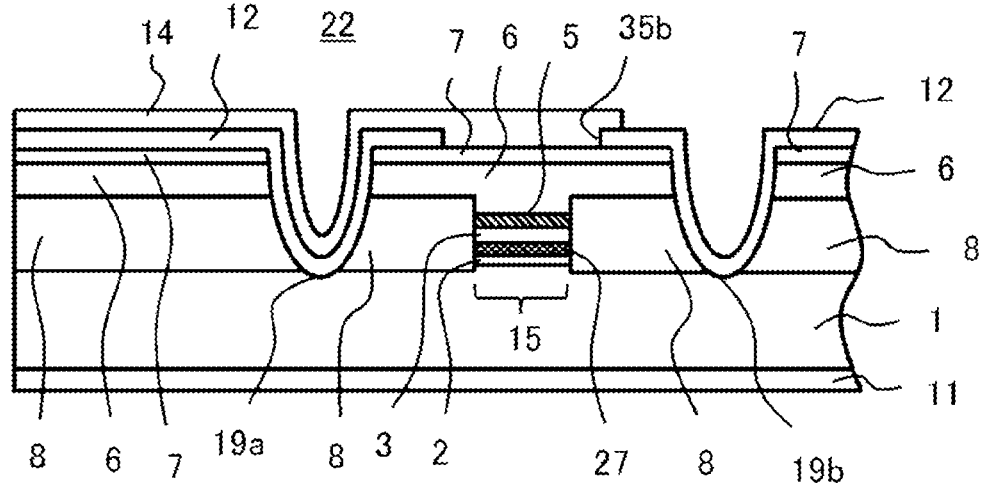
FIG. 17 is a cross-sectional view of the modulator part in the semiconductor laser device of FIG. 15.
Figure 18:
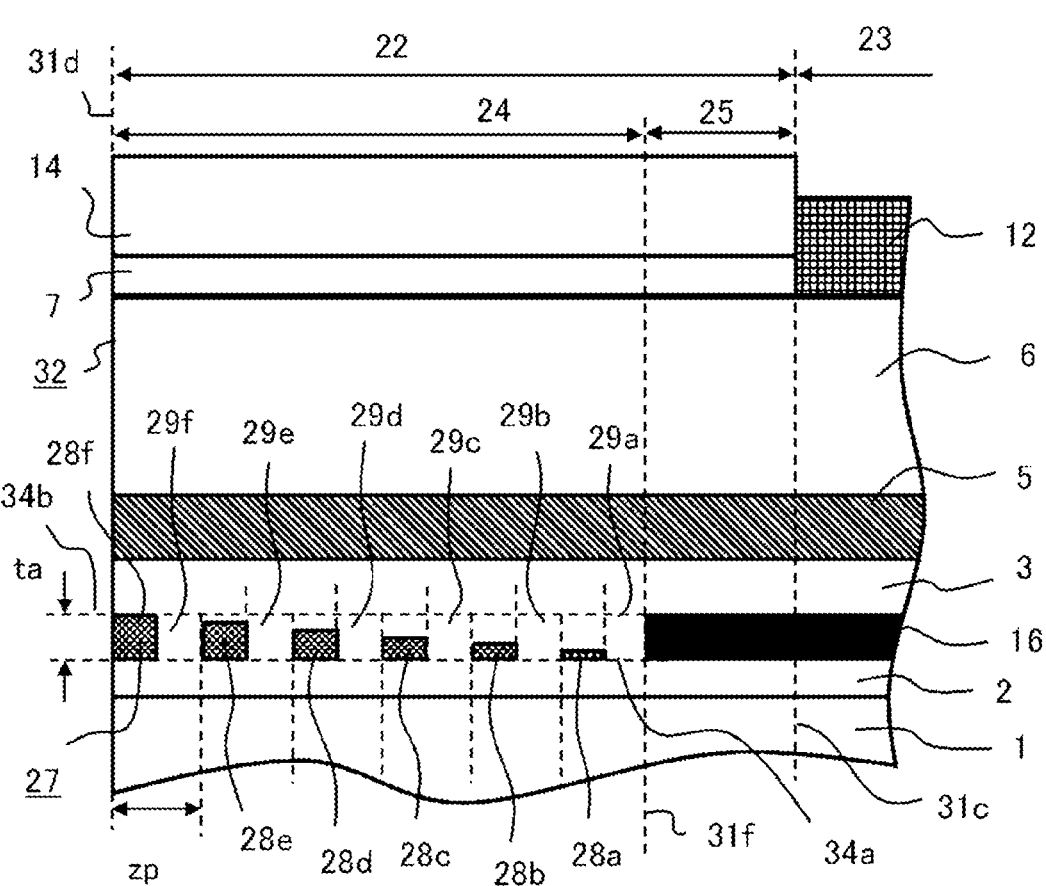
FIG. 18 shows a diagram showing a diffraction grating of the second example in the modulator part of FIG. 15.
Figure 19:
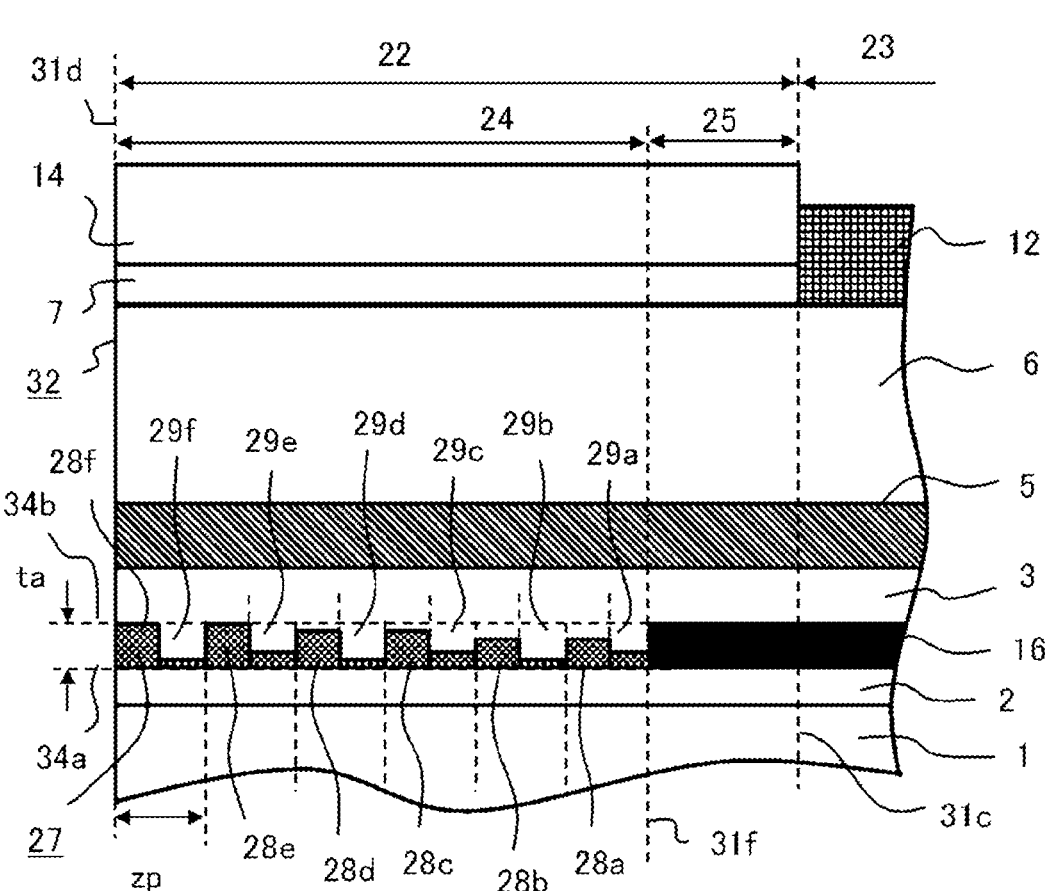
FIG. 19 is a diagram showing a diffraction grating of the third example in the modulator part of FIG. 15.

FIG. 15 is a perspective view showing a semiconductor laser device according to Embodiment 3, FIG. 16 is a diagram showing a diffraction grating of the first example in a modulator part of FIG. 15, and FIG. 17 is a cross-sectional view of the modulator part in the semiconductor laser device of FIG. 15. FIG. 18 is a diagram showing a diffraction grating of the second example in the modulator part of FIG. 15, and FIG. 19 is a diagram showing a diffraction grating of the third example in the modulator part of FIG. 15. The semiconductor laser device 50 of Embodiment 3 is different from the semiconductor laser device 50 of Embodiment 1 in that a diffraction grating 27 in which the depth of the recess 29 or/and the thickness of the protrusion 28 are non-uniform is formed in the diffraction grating region 24 of the modulator part 22. A part different from the semiconductor laser device 50 of Embodiment 1 will mainly be described.

As shown in FIG. 16, the diffraction grating 27 includes six protrusions 28a, 28b, 28c, 28d, 28e, and 28f and six recesses 29a, 29b, 29c, 29d, 29e, and 29f. Note that, the reference numeral 28 is collectively used for the protrusions, and 28a, 28b, 28c, 28d, 28e and 28f are used for distinction. The reference numeral 29 is collectively used for the recesses, and 29a, 29b, 29c, 29d, 29e, and 29f are used for distinction. FIG. 16 shows an example in which the protrusion 28 is the same in thickness as the film thickness ta of the diffraction grating material layer 16 and the depths of the recesses 29a, 29b, 29c, 29d, 29e, 29f formed by removing the diffraction grating material layer 16 are not the same. That is, in the diffraction grating 27 of the first example in the modulator part 22 shown in FIG. 16, the example is such that the thickness of the protrusion 28 is uniform, and the depth of the recess 29 formed by removing the diffraction grating material layer 16 is non-uniform.

In FIG. 16, the interval between the dashed line 31f and the end of the protrusion 28a on the side to the emission end face 32 is zp, the same as the interval between the end of the protrusion 28e on the side to the emission end face 32 and the end of the protrusion 28f on the side to the emission end face 32. Note that, the end of the protrusion 28f on the side to the emission end face 32 coincides with the emission end face 32. The interval between the end of the protrusion 28a on the side to the emission end face 32 and the end of the protrusion 28b on the side to the emission end face 32, the interval between the end of the protrusion 28b on the side to the emission end face 32 and the end of the protrusion 28c on the side to the emission end face 32, the interval between the end of the protrusion 28c on the side to the emission end face 32 and the end of the protrusion 28d on the side to the emission end face 32, and the interval between the end of the protrusion 28d on the side to the emission end face 32 and the end of the protrusion 28e on the side to the emission end face 32 each are zp. The interval zp is the interval in the protrusion 28 and recess 29 that are adjacent in a pair, which is the same. FIG. 16 shows an example in which the width of the protrusion 28 in the z-direction and the width of the recess 29 in the z-direction are the same. In the diffraction grating 27 of Embodiment 3, the period in the protrusion 28 and the recess 29 is the same over the entire diffraction grating. That is, in the diffraction grating 27 of Embodiment 3, the period in the protrusion 28 and the recess 29 is uniform. However, in the diffraction grating 27 of Embodiment 3, the depth of the recess 29 as described above or/and the thickness of the protrusion 28 are non-uniform in the diffraction grating region 24 of the modulator part 22.

When the depth of a groove, that is, the recess 29 of the diffraction grating or/and the thickness of the portion in which the groove is not formed, that is, the protrusion 28, is changed, an equivalent refractive index of the diffraction grating changes. A diffraction grating having a non-uniform equivalent refractive index with respect to the z-direction expands the wavelength band of light reflection of the diffraction grating as compared with the diffraction grating having a uniform equivalent refractive index. That is, the semiconductor laser device 50 of Embodiment 3 provided with the diffraction grating 27 in which the equivalent refractive index is non-uniform with respect to the z-direction in the modulator part 22 can expand the wavelength band of light reflection that occurs at the diffraction grating as compared with the semiconductor laser device 50 of Embodiment 1 provided with the diffraction grating 18 in which the equivalent refractive index is uniform with respect to the z-direction in the modulator part 22. Thus, in the semiconductor laser device 50 of Embodiment 3, even when the drive conditions of the laser part 21 or/and the modulator part 22 change or when the element size of the semiconductor laser device 50 changes due to the manufacturing variation, the output light generated from the laser part 21 can be reliably reflected by the diffraction grating 27 of the modulator part 22 toward the laser part 21. That is, in the semiconductor laser device 50 of Embodiment 3, the effects of the semiconductor laser device 50 of Embodiment 1 that the variation of the amount of adiabatic chirp for each semiconductor laser device can be suppressed and the decrease in the transmission yield can be avoided can be obtained even in one or both of the case where the drive conditions change and the case where the manufacturing variation occurs as compared with the semiconductor laser device 50 of Embodiment 1. That is, the semiconductor laser device 50 of Embodiment 3 is more resistant to the change in the drive conditions and the manufacturing variation than the semiconductor laser device 50 of Embodiment 1.

The semiconductor laser device 50 of Embodiment 3 has the same structure as the semiconductor laser device 50 of Embodiment 1 except for the diffraction grating of the modulator part 22. Therefore, since the semiconductor laser device 50 of Embodiment 3 has the structure in which at least the diffraction grating 27 is not formed in the separation part 23 or the structure in which the non-diffraction grating region 25 in which the diffraction grating 27 is not formed exists between the emission end face of the laser part 21 and the emission end face 32, as in the semiconductor laser device 50 of Embodiment 1, it is possible to increase the optical output of the laser light as compared with the semiconductor laser device of Patent Document 1.

The semiconductor laser device 50 of Embodiment 3 is provided with the diffraction grating 27 having the non-uniform equivalent refractive index with respect to the z-direction in the mesa stripe 15 of the modulator part 22, so that reflected light that occurs at the forward side of the element of the semiconductor laser device 50, that is, at the emission end face 32, is directed to a position away from the absorption layer 5 and the active layer 4 by the diffraction grating 27 of the modulator part 22 in which the wavelength band of light reflection is expanded. Therefore, the propagation of the reflected light from the forward side of the element to the active layer 4 of the laser part 21 can be suppressed, the variation in the amount of adiabatic chirp for each semiconductor laser device can be suppressed, and the decrease in the transmission yield can be avoided.

In the semiconductor laser device 50 of Embodiment 3, similarly to the semiconductor laser device 50 of Embodiment 1, it is not necessary to add the wave guide provided with the diffraction grating in the forward side of the modulator part 22, that is, on the side of the emission end face 32. Therefore, the semiconductor laser device 50 of Embodiment 3 is easy in the manufacturing process and has a smaller element size than the semiconductor laser device having the structure in which the waveguide provided with the diffraction grating is added, so that the cost can be reduced.

The diffraction grating 27 whose equivalent refractive index is non-uniform with respect to the z-direction is not limited to the structure of FIG. 16. As in the diffraction grating 27 of the second example in the modulator part 22 shown in FIG. 18, the thickness of the protrusion 28 may be non-uniform, and the depth of the recess 29 formed by removing the diffraction grating material layer 16 may be uniform. Further, as in the diffraction grating 27 of the third example in the modulator part 22 shown in FIG. 19, the thickness of the protrusion 28 may be non-uniform, and the depth of the recess 29 formed by removing the diffraction grating material layer 16 may be non-uniform. FIG. 18 shows an example in which the protrusion 28 increases in thickness in accordance with the position in the positive direction of the z-direction and the depth of the recess 29 is uniform. FIG. 19 shows an example in which the protrusion 28 of the two in a pair increases in thickness in accordance with the position on the positive side in the z-direction, and the recess 29 of the two in a pair has a deep recess and a shallow recess.

The thicknesses of the protrusions 28a, 28b, 28c, 28d, 28e and 28f are ha, hb, hc, hd, he and hf, respectively, and the depths of the recesses 29a, 29b, 29c, 29d, 29e and 29f are da, db, dc, dd, de and df, respectively. The thickness of the protrusion 28 is the thickness on the positive side (upper side in FIG. 18 and FIG. 19) in the y-direction with respect to the dashed line 34a. The depth of the recess 29 is the depth on the negative side (lower side in FIG. 18 and FIG. 19) in the y-direction with respect to the dashed line 34b. For the diffraction grating 27 of the second example in the modulator part 22 shown in FIG. 18, a formula (2) and a formula (3) are satisfied, and for the diffraction grating 27 of the third example in the modulator part 22 shown in FIG. 19, a formula (4) and a formula (5) are satisfied.

$$hf > he > hd > hc > hb > ha \tag{2}$$

$$df = de = dd = dc = db = da \tag{3}$$

$$(hf = he) > (hd = hc) > (hb = ha) \tag{4}$$

$$(df = dd = db) < (de = dc = da) \tag{5}$$

In the formula (4) and the formula (5), the equal thickness or depth is enclosed by parentheses, and the relationship between the sizes for each of the parentheses is clarified.

In FIGS. 18 and 19, similarly to FIG. 16, the interval between the dashed line 31f and the end of the protrusion 28a on the side to the emission end face 32 is zp, similarly to the interval between the end of the protrusion 28e on the side to the emission end face 32 and the end of the protrusion 28f on the side to the emission end face 32. Note that, the end of the protrusion 28f on the side to the emission end face 32 coincides with the emission end face 32. The interval between the end of the protrusion 28a on the side to the emission end face 32 and the end of the protrusion 28b on the side to the emission end face 32, the interval between the end of the protrusion 28b on the side to the emission end face 32 and the end of the protrusion 28c on the side to the emission end face 32, the interval between the end of the protrusion 28c on the side to the emission end face 32 and the end of the protrusion 28d on the side to the emission end face 32, and the interval between the end of the protrusion 28d on the side to the emission end face 32 and the end of the protrusion 28e on the side to the emission end face 32 each are zp. The interval zp is the interval in the protrusion 28 and recess 29 that are adjacent in a pair, which is the same. FIG. 18 and FIG. 19 show an example in which the width of the protrusion 28 in the z-direction and the width of the recess 29 in the z-direction are the same.

Note that, although various exemplary embodiments and examples are described in the present application, various features, aspects, and functions described in one or more embodiments are not inherent in a particular embodiment and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE NUMERALS AND SIGNS

1: semiconductor substrate, 4: active layer, 5: absorption layer, 11: cathode electrode, 13: first anode electrode, 14: second anode electrode, 15: mesa stripe, 16: diffraction grating material layer, 17: diffraction grating, 18: diffraction grating, 21: laser part, 22: modulator part, 23: separation part, 25: non-diffraction grating region, 26: diffraction grating, 27: diffraction grating, 28, 28a, 28b, 28c, 28d, 28e, 28f: protrusion, 29, 29a, 29b, 29c, 29d, 29e, 29f recess, 32: emission end face, 50: semiconductor laser device, za, zb, zc, zd: interval

The invention claimed is:

1. A semiconductor laser device in which a distributed feedback laser part and an electro-absorption modulator part are formed on the same semiconductor substrate, the semiconductor laser device comprising:

the laser part including a first diffraction grating formed to extend in a direction of an optical axis of laser light emitted from the laser part;

the modulator part partially including a second diffraction grating formed to extend in the direction of the optical axis of the laser, wherein in a view perpendicular to the optical axis, the second diffraction grating entirely overlaps the modulator part; and an anode electrode of the modulator part formed on a front side of the semiconductor substrate and terminating at an emission end face of the modulator part, wherein:

a non-diffraction grating region in which a diffraction grating is not formed is interposed between the second diffraction grating of the modulator part and an emission end face of the laser part from which the laser light is emitted to the modulator part;

the laser light is emitted from the emission end face of the modulator part;

the laser part includes an anode electrode, and an insulation layer is formed directly between the anode electrode of the laser part and the anode electrode of the modulator part, wherein the insulation layer is also positioned between the anode electrode of the modulator part and the second diffraction grating.

2. The semiconductor laser device according to claim 1, wherein the first diffraction grating includes a plurality of first protrusions extending in a direction perpendicular to the semiconductor substrate, and a plurality of first recesses being recessed toward the semiconductor substrate from faces of the first protrusions on a side opposite to the semiconductor substrate;

the second diffraction grating includes a plurality of second protrusions extending in the direction perpendicular to the semiconductor substrate, and a plurality of second recesses being recessed toward the semiconductor substrate from faces of the second protrusions on a side opposite to the semiconductor substrate; and the second recesses of the second diffraction grating have the same depth in the direction perpendicular to the semiconductor substrate as that of the first recesses of the first diffraction grating.

3. The semiconductor laser device according to claim 2, wherein the second diffraction grating is non-uniform in thickness in the second recesses in the direction perpendicular to the semiconductor substrate.

4. The semiconductor laser device according to claim 2, wherein the second diffraction grating is formed of the same diffraction grating material layer as the first diffraction grating.

5. The semiconductor laser device according to claim 1, wherein the first diffraction grating includes a plurality of first protrusions extending in a direction perpendicular to the semiconductor substrate, and a plurality of first recesses being recessed toward the semiconductor substrate from faces of the first protrusions on a side opposite to the semiconductor substrate;

the second diffraction grating includes a plurality of second protrusions extending in the direction perpendicular to the semiconductor substrate, and a plurality of second recesses being recessed toward the semiconductor substrate from faces of the second protrusions on a side opposite to the semiconductor substrate; and the second diffraction grating is non-uniform in depth in the second recesses in the direction perpendicular to the semiconductor substrate.

6. The semiconductor laser device according to claim 5, wherein the second diffraction grating has a uniform interval in the direction of the optical axis of the laser light in each second protrusion and each second recess that are adjacent in a pair.

7. The semiconductor laser device according to claim 5, wherein the second diffraction grating is non-uniform in thickness in the second recesses in the direction perpendicular to the semiconductor substrate.

8. The semiconductor laser device according to claim 1, wherein the second diffraction grating is formed of the same diffraction grating material layer as the first diffraction grating.

9. The semiconductor laser device according to claim 1, wherein the non-diffraction grating region is provided on a side to the laser part in the modulator part.

10. The semiconductor laser device according to claim 1, further comprising:

a cathode electrode formed on a rear surface of the semiconductor substrate;

an anode electrode of the laser part formed on a front side of the semiconductor substrate; and a separation part in which the anode electrode of the modulator part is separated from the anode electrode of the laser part, the separation part being provided between the modulator part and the emission end face of the laser part.

11. The semiconductor laser device according to claim 1, further comprising:

the laser part including a first mesa stripe that is a mesa formed to extend in the direction of the optical axis of the laser light and includes an active layer and the first diffraction grating;

the modulator part including a second mesa stripe that is a mesa formed to extend in the direction of the optical axis of the laser light and includes an absorption layer and the second diffraction grating, and the non-diffraction grating region including a third mesa stripe that is a mesa formed to extend in the direction of the optical axis of the laser light and includes an absorption layer connected to the absorption layer of the modulator part and the active layer of the laser part, the non-diffraction grating region being provided between an end of the modulator part on the side to the laser part and the emission end face of the laser part from which the laser light is emitted to the modulator part; wherein the first mesa stripe, the second mesa stripe, and the third mesa stripe are continuous.

12. The semiconductor laser device according to claim 1, wherein in the view perpendicular to the optical axis, an entirety of the second diffraction grating overlaps the anode electrode.

13. A semiconductor laser device in which a distributed feedback laser part and an electro-absorption modulator part are formed on the same semiconductor substrate, the semiconductor laser device comprising:

the laser part including a first diffraction grating formed to extend in a direction of an optical axis of laser light emitted from the laser part; and the modulator part at least partially including a second diffraction grating formed to extend in the direction of the optical axis of the laser and the modulator part further comprising an anode electrode of the modulator part formed on a front side of the semiconductor substrate and terminating at an emission end face of the modulator part, wherein a non-diffraction grating region in which a diffraction grating is not formed is interposed between the second diffraction grating of the modulator part and an emission end face of the laser part from which the laser light is emitted to the modulator part;

wherein the first diffraction grating includes a plurality of first protrusions extending in a direction perpendicular to the semiconductor substrate, and a plurality of first recesses being recessed toward the semiconductor substrate from faces of the first protrusions on a side opposite to the semiconductor substrate;

the second diffraction grating includes a plurality of second protrusions extending in the direction perpendicular to the semiconductor substrate, and a plurality of second recesses being recessed toward the semiconductor substrate from faces of the second protrusions on a side opposite to the semiconductor substrate; and

the second recesses of the second diffraction grating have the same depth in the direction perpendicular to the semiconductor substrate as that of the first recesses of the first diffraction grating; and wherein:

the second diffraction grating has a uniform interval in the direction of the optical axis of the laser light in each second protrusion and each second recess that are adjacent in a pair, the laser light is received by the modulator part and emitted from the emission end face of the modulator part, in a view perpendicular to the optical axis, the second diffraction grating entirely overlaps the modulator part;

the laser part includes an anode electrode, and an insulation layer is formed directly between the anode electrode of the laser part and the anode electrode of the modulator part, wherein the insulation layer is also positioned between the anode electrode of the modulator part and the second diffraction grating.

14. The semiconductor laser device according to claim 13, wherein the second diffraction grating is non-uniform in thickness in the second recesses in the direction perpendicular to the semiconductor substrate.

15. The semiconductor laser device according to claim 13, wherein the second diffraction grating is formed of the same diffraction grating material layer as the first diffraction grating.

16. The semiconductor laser device according to claim 13, wherein in the view perpendicular to the optical axis, an entirety of the second diffraction grating overlaps the anode electrode.

* * * * *